United States Patent [19]

Yamano et al.

[11] 4,334,120
[45] Jun. 8, 1982

[54] SUNLIGHT-INTO-ENERGY CONVERSION APPARATUS

[75] Inventors: Masaru Yamano, Hirakata; Yukinori Kuwano, Takatsuki, both of Japan

[73] Assignee: Sanyo Electric Co., Ltd., Moriguchi, Japan

[21] Appl. No.: 129,716

[22] Filed: Mar. 12, 1980

[30] Foreign Application Priority Data

Mar. 20, 1979 [JP] Japan .................................. 54-32814
Feb. 13, 1980 [JP] Japan .................................. 55-16901

[51] Int. Cl.³ .......................... H01L 31/04; F24J 3/02
[52] U.S. Cl. .................................. 136/248; 136/244; 136/251; 136/258; 126/443; 126/446
[58] Field of Search ............... 136/248, 258, 259, 255, 136/244, 247, 246, 251; 126/443, 446

[56] References Cited

U.S. PATENT DOCUMENTS

| | | | |
|---|---|---|---|
| 3,990,914 | 11/1976 | Weinstein et al. | 136/246 |
| 4,064,521 | 12/1977 | Carlson | 357/2 |
| 4,081,289 | 3/1978 | Campbell | 136/246 |
| 4,144,095 | 3/1979 | Miausky | 136/246 |
| 4,210,463 | 7/1980 | Escher | 136/246 |
| 4,222,371 | 9/1980 | Heath | 126/440 |
| 4,235,221 | 11/1980 | Murphy | 126/415 |

FOREIGN PATENT DOCUMENTS

2700767 7/1978 Fed. Rep. of Germany ...... 136/248

OTHER PUBLICATIONS

D. E. Carlson, "Amorphous–Silicon Solar Cells", Quarterly Report No. 6, Jun. 1978, Department of Energy by RCA Labs, Report No. PRRL-78-CR-29, pp. 23–26.

Primary Examiner—Aaron Weisstuch
Attorney, Agent, or Firm—Darby & Darby

[57] ABSTRACT

The present application discloses a sunlight-into-energy conversion apparatus in which at least one amorphous silicon solar cell having a thickness thin enough to permit the sunlight to pass therethrough is formed on the surface of a heat collecting plate attached to a heating medium tube in a thermal conductive manner, thereby permitting the sunlight to be effectively converted into thermal energy and electrical energy.

When a plurality of such amorphous silicon solar cells are formed on the surface of the heat collecting plate through insulating films, respectively and connected in series to each other, high electromotive force may be obtained.

13 Claims, 9 Drawing Figures

SUNLIGHT-INTO-ENERGY CONVERSION APPARATUS

FIELD OF THE INVENTION

This invention relates to a sunlight-into-energy conversion apparatus in which amorphous solar cells each having a thickness thin enough to permit the sunlight to pass therethrough are formed on the surface of a heat collecting plate attached to a heating medium tube in a thermal conductive manner, whereby the sunlight may be converted into electrical energy by the solar cells, simultaneously with the conversion of the sunlight passing through such solar cells into thermal energy by the heat collecting plate.

BACKGROUND OF THE INVENTION

It has been known to convert sunlight into thermal energy by a solar heat collecting apparatus using a heat collecting plate, and to convert sunlight into electrical energy by a solar cell. There has also been proposed a sunlight-into-energy conversion apparatus in which a solar cell serving as a sunlight-into-electricity conversion means has been attached to the heat collecting plate of the solar heat collecting apparatus. However, such proposed solar cell has been constituted by single crystal silicon and has had a thickness of about 300μ, so that the sunlight could not pass therethrough. Therefore, when such solar cell having a relatively thick thickness is attached to the heat collecting plate of a solar heat collecting apparatus, that portion of the heat collecting plate covered by the solar cell becomes ineffective in collecting solar heat, whereby the sunlight may not effectively be converted into thermal energy.

DISCLOSURE OF THE INVENTION

According to a sunlight-into-energy conversion apparatus of the present invention, at least one amorphous solar cell having such a thickness as to permit the sunlight to pass therethrough is formed on the surface of a heat collecting plate attached to a heating medium tube in a thermal conductive manner, so that the sunlight is converted into electrical energy by such solar cell, simultaneously with the conversion of the sunlight passing through such solar cell into thermal energy by the heat collecting plate, whereby the entire heat collecting plate including the portion thereof covered by the solar cell may fully be effective in collecting solar heat, thus enabling the sunlight to be effectively converted both into thermal energy and electrical energy.

BRIEF DESCRIPTION OF THE DRAWINGS

The invention will be further described by way of example, with reference to the accompanying drawings, in which.

DETAILED DESCRIPTION OF THE PREFERRED EMBODIMENTS

The description hereinafter will discuss in detail one embodiment of the sunlight-into-energy conversion apparatus in accordance with the present invention, with reference to FIGS. 1 and 2.

Figure 1:
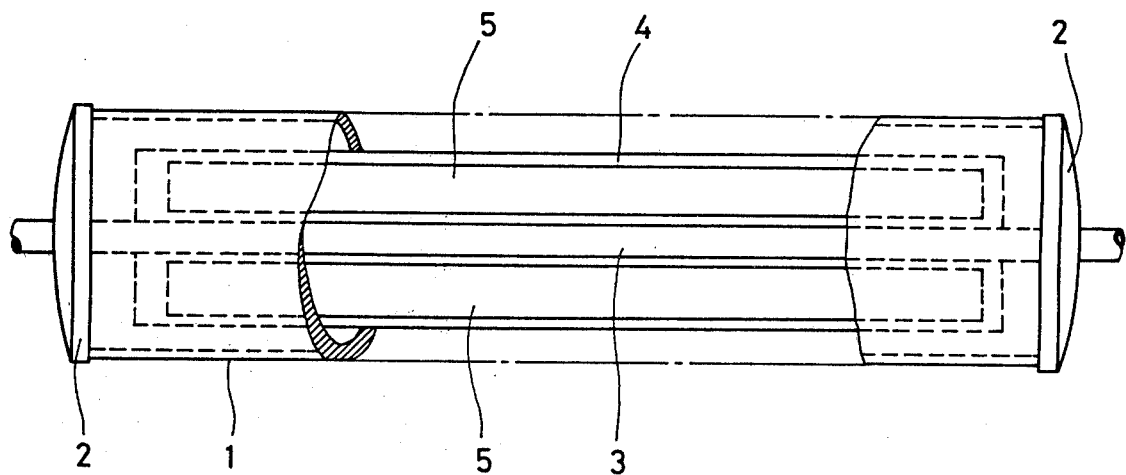
FIG. 1 is a front view, with portions broken away, of one embodiment of a sunlight-into-energy conversion apparatus in accordance with the present invention.
Figure 2:
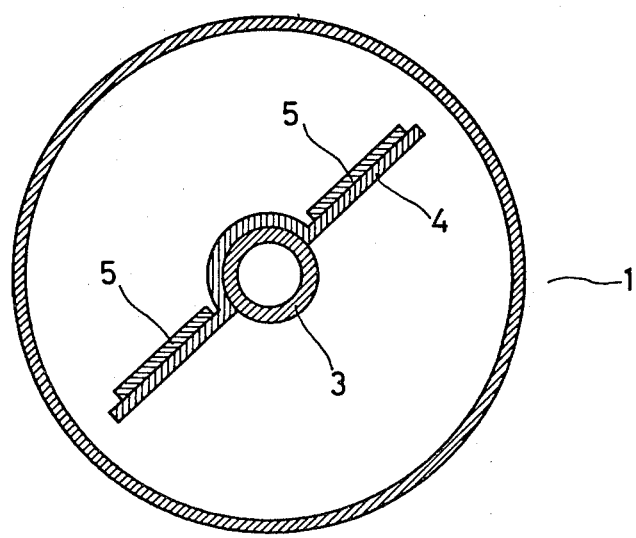
FIG. 2 is a section view in the side elevation in FIG. 1.

In FIGS. 1 and 2, a light-permeable outer tube 1 made of, for example glass, has end openings hermetically closed by metallic end plates 2, thereby to provide a vacuum in the inside of the outer tube 1. A heating medium such as water is adapted to be flowed inside a heating medium tube 3 made of copper. Both ends of this heating medium tube 3 pass through the end plates 2, respectively, and the passing portions of the heating medium tube 3 are welded to the end plates 2.

A heat collecting plate 4 made of copper or aluminium is attached to the heating medium tube 3 in a thermal conductive manner and is adapted to be heated by sunlight having a wavelength of about 0.7 $\mu$m to 1.5 $\mu$m, thereby to heat a heating medium such as water flowing in the heating medium tube 3.

Amorphous silicon solar cells 5 are formed directly on the heat collecting plate 4 which constitutes one electrode of each of the amorphous silicon solar cells 5. Each of these amorphous silicon solar cells has a thickness of 0.1 to 10$\mu$ so as to permit sufficient sunlight to pass therethrough.

A description will then be given of how to manufacture such amorphous silicon solar cells.

Figure 3:
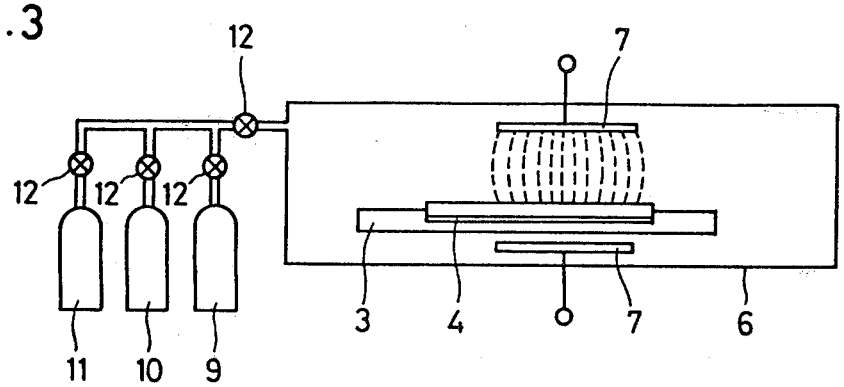
FIG. 3 is a schematic view of one example of equipment for producing solar cells to be used in the present invention.
Figure 4:
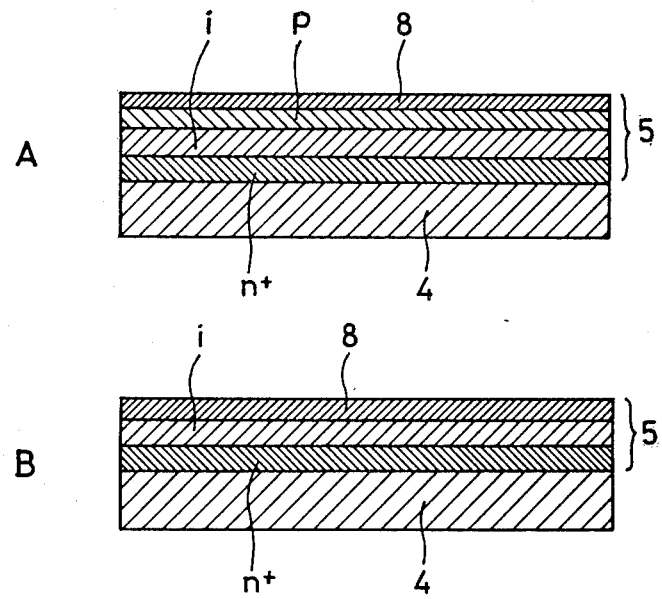
FIG. 4 is an enlarged section view of a solar cell to be used in the present invention, with A illustrating a solar cell of the P-i-n type and B illustrating a solar cell of the Schottky type.

As shown in FIG. 3, a pair of electrodes 7 are disposed in a vacuum plasma reaction vessel 6 and the heat collecting plate 4 is disposed between the electrodes 7. A gas mixture of silane and phosphine is firstly introduced into the vessel 6. A voltage from a high frequency power supply is applied across the electrodes 7 to perform plasma discharge, thereby to generate an n+ type amorphous silicon layer (n+ layer) on the heat collecting plate as shown in FIG. 4-A. Silane gas only is then introduced into the vessel 6 to generate an intrinsic amorphous silicon layer (i layer) on the n+ layer in the same manner as above-mentioned. Finally, a gas mixture of silane and diborane is introduced into the vessel 6 to generate a P type amorphous silicon layer (P layer) on the i layer in the same manner as above-mentioned. It is here to be noted that, when forming such layers, a mask suitable to each respective layer is placed thereon to perform masking. Thereafter, with the use of another apparatus different from that shown in FIG. 3, a transparent upper electrode 8 is formed on the P layer by, for example vapor coating, whereby a solar cell of the P-i-n type may be formed.

In FIG. 3, cylinders of silane (SiH$_4$), diborane (B$_2$H$_6$) and phosphine (PH$_3$) are generally designated by 9, 10 and 11, respectively, and valves by 12.

When forming a Schottky-type solar cell, as shown in FIG. 4-B an n+ type layer is formed by the introduction of a gas mixture of silane and phosphine into the plasma reaction vessel 6 shown in FIG. 3 in the same manner as above-mentioned. An i layer is then formed by the introduction of silane gas alone. A semi-transparent upper electrode 8 made of, for example platinum, is formed on the i layer, whereby a Schottky-type solar cell is formed on the heat collecting plate 4.

Concerning the thickness of the respective layers, the n+ layer has a thickness of 0.03$\mu$, the i layer a thickness of 0.94$\mu$, the P layer a thickness of 0.01$\mu$, and the upper electrode 8 a thickness of 0.03 to 0.04$\mu$. According to the results of tests conducted by the inventor or others, it was found that the optimum thickness from the n+ layer to the upper electrode 8 was from 0.1$\mu$ to 10$\mu$.

A description will now be made of how to ouput electromotive force of the solar cells 5 to the outside with respect to the outer tube 2.

Figure 5:
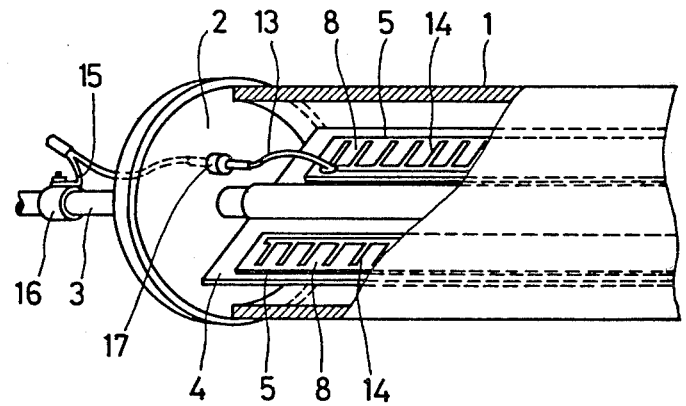
FIG. 5 is a perspective view, with portions broken away, of one example of the arrangement of lead wires in the present invention.

As shown in FIG. 5, a lead wire 13 passes through the metallic end plate 2 and is connected at the tip thereof to one of collector electrodes 14 formed in a comb shape on the upper cell surface 8, which constitute one electrode of each of the solar cells 5. It is here to be noted that said one of the collector electrodes 14 is electrically connected to the other collector electrode 14. Since the other electrodes of the solar cells 5 are formed by the heat collecting plate 4 which is electrically connected to the heating medium tube 3, another lead wire 15 is connected, through a ring 16, to that portion of the heating medium tube 3 which projects from the end plate 2.

A seal 17 is adapted to electrically insulate the lead wire 13 from the end plate 2 and to maintain airtightness in the outer tube 1.

Figure 6:
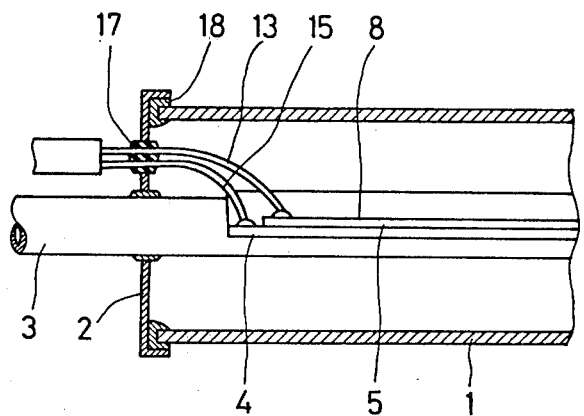
FIG. 6 is a section view in the front elevation of another example of the arrangement of lead wires in the present invention.

Besides the arrangement shown in FIG. 5, electromotive force of the solar cell may also be outputted with a different arrangement shown in FIG. 6.

In FIG. 6, two lead wires 13 and 15 pass through the end plate 2 and are connected at the tips thereof to the upper electrodes 8 and the heat collecting plate 4, respectively.

A seal 18 hermetically seals the peripheral edge of the outer tube 1 with respect to the periphery of the end plate 2.

Figure 7:
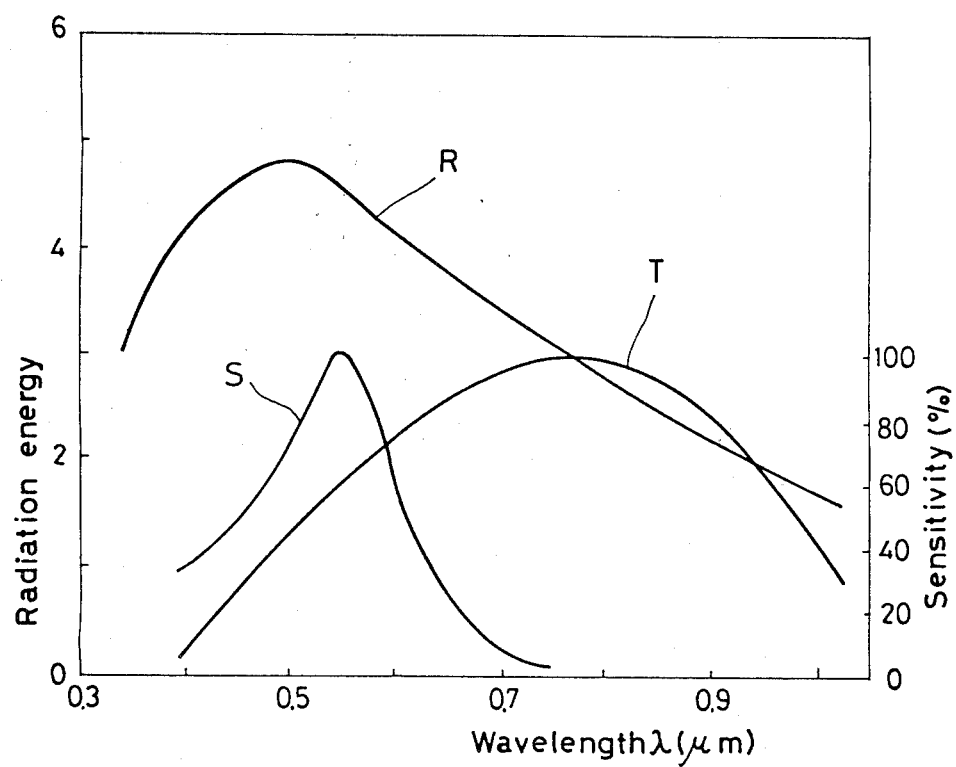
FIG. 7 shows a relationship between the sunlight energy distribution characteristics and solar cell sensitivity characteristics.

A description will then be given of how sunlight energy is effectively utilized in the present invention, with reference to FIG. 7.

FIG. 7 shows the sunlight energy distribution characteristic, the sensitivity of the solar cell of the present invention, i.e. an amorphous silicon cell and the sensitivity of a conventional solar cell, i.e. a single crystal silicon cell; in which the curve R is the spectrum of sunlight, the curve S is the sensitivity characteristic of the solar cell according to the present invention, and the curve T is the sensitivity characteristic of a conventional solar cell.

According to FIG. 7, the usual sunlight-into-heat conversion means mainly utilizes the infrared rays (0.7 $\mu$m to 1.5 $\mu$m) of the sunlight, and such infrared rays heat a heating medium in the heating medium tube through a heat collecting plate. Therefore, visible radiation having wavelengths from 0.35 $\mu$m to 0.7 $\mu$m is not utilized for solar heat collecting purposes.

On the other hand, the sensitivity of the amorphous silicon solar cell 5 of the present invention resides in the range of wavelengths from 0.35 to 0.7 $\mu$m as shown by the curve S. This means the amorphous silicon solar cell of the present invention utilizes the exact portion of the sunlight which is not utilized for solar heat collecting purpose. Accordingly, the present invention may effectively utilize substantially the entire range of sunlight energy and convert the same both into thermal energy and electrical energy.

Furthermore, as compared with the thickness of a conventional solar cell of about 300$\mu$, each of the solar cells of the present invention has an extremely thin thickness of 0.1 to 10$\mu$, thereby permitting the sunlight to pass therethrough, whereby such sunlight passing through the solar cells may be thermally collected by the entire heat collecting plate 4.

Electrical energy converted from sunlight having wavelength from 0.35 to 0.7 $\mu$m by the solar cells of the present invention may be outputted from the heat collecting plate 4 and the upper electrodes 8 as shown in FIGS. 5 and 6.

As shown in FIG. 7, a conventional single crystal silicon solar cell has a peak sensitivity at a wavelength in the vicinity of 0.8 $\mu$m. This means a portion of the sunlight subjected to a light-into-heat conversion is also subjected to a light-into-electricity conversion. That is, sunlight-into-heat conversion and sunlight-into-electricity conversion are performed on a portion of the sunlight in the same wavelength range, so that the sunlight may not effectively be utilized.

Moreover, since such a conventional single crystal silicon solar cell has a thickness of 300$\mu$ or more which prevents the sunlight from passing through such conventional solar cell, the portion of the heat collecting plate beneath such solar cell may not be heated, thereby reducing the heat collecting effect.

However, as discussed hereinbefore, the solar cell according to the present invention has a thickness thin enough to permit the sunlight to pass therethrough and is constructed such that the wavelength range of the sunlight to be subjected to sunlight-into-heat conversion is not overlapped with the wavelength range to be subjected to sunlight-into-electricity conversion, whereby the entire wavelength range of the sunlight may effectively be converted into energy.

According to the present invention, hermetic sealing of the heat collecting plate 4 in the light-permeable outer tube 1 may eliminate dust contamination and the influences of rain and frost which exert adverse effects upon the characteristics of the solar cell, and may also reduce the intensity of ultraviolet rays which exert considerably adverse effects upon the life-time of solar cells, whereby the life-time of the solar cell may advantageously be lengthened.

In connection with the solar heat collecting effect, an insulating space is formed around the outer circumferential surface of the heating medium tube 3, thereby to effectively prevent heat radiation from the heating medium tube 3.

Figure 8:
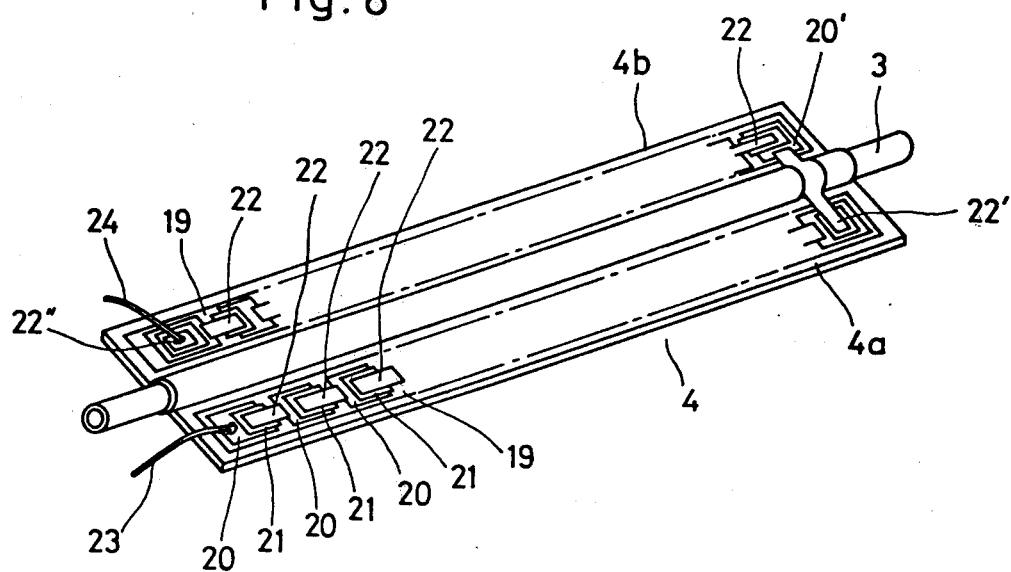
FIG. 8 is a perspective view of another embodiment of a sunlight-into-energy conversion apparatus in accordance with the present invention.
Figure 9:
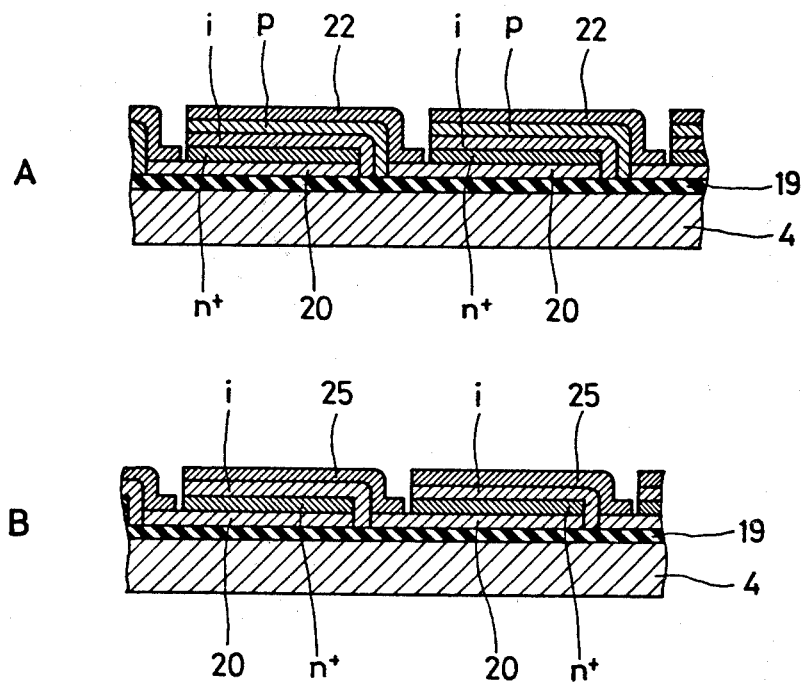
FIG. 9 is an enlarged section view of a solar cell to be used in the embodiment in FIG. 8, with A illustrating a solar cell of the P-i-n type and B illustrating a solar cell of the Schottky type.

A description will then be given of how to obtain a high electromotive force in the present invention, with reference to FIGS. 8 and 9.

In FIG. 8, insulating films 19 are disposed on the heat collecting plate 4 and a plurality of lower electrodes 20 made of aluminum are disposed on the insulating films 19. Amorphous silicon layers 21 are disposed on the respective lower electrodes 20 and light-permeable upper electrodes 22 are disposed on the respective amorphous silicon layers 21. Thus, a plurality of amorphous solar cells are constituted by the lower electrodes 20, the amorphous silicon layers 21, and the upper electrodes 22. Each of the upper electrodes 22 is electrically connected to the adjacent lower electrode 20.

A lead wire 23 passing through the end plate is connected to the lower electrode 20 disposed at one end of one side 4a of the heat collecting plate 4. The upper electrode 22' disposed at the other end of one side 4a of the heat collecting plate 4 is connected to the lower electrode 20' disposed at the other end of the other side 4b of the heat collecting plate 4. A lead wire 24 is connected to the upper electrode 22" disposed at one end of the other side 4b of the heat collecting plate 4.

By the above means a plurality of amorphous solar cells are connected in series to each other, so that high electromotive force may be obtained from the lead wires 23 and 24.

FIG. 9-A illustrates a fragmentary section of the solar cells connected as shown in FIG. 8, and more particularly a fragmentary section of amorphous silicon solar cells of the P-i-n type, in which transparent conductive films made of, for example ITO (Indium Tin Oxide), may suitably be used for the upper electrodes 22.

FIG. 9-B illustrates amorphous silicon solar cells of the Schottky type, in which platinum is generally used for the semi-transparent upper electrodes 25.

It is here to be characteristically noted that a plurality of such multistaged amorphous silicon solar cells may be manufactured at the same time in a gas mixture of silane, diborane, phosphine or others, according to the glow discharge method.

Industrial Utility

According to the sunlight-into-energy conversion apparatus of the present invention, at least one amorphous silicon solar cell having a thickness thin enough to permit the sunlight to pass therethrough is formed on the surface of the heat collecting plate attached to the heating medium tube in a thermal conductive manner, so that sunlight energy may be converted into electrical energy by the solar cell, simultaneously with the conversion of sunlight energy passing through the solar cell into thermal energy by the heat collecting plate, whereby the entire heat collecting plate including the portion thereof covered by the solar cell may fully be effective in collecting solar heat, thus enabling sunlight energy to be effectively converted both into thermal energy and electrical energy.

Moreover, according to the present invention, the portion of the sunlight subjected to sunlight-into-heat conversion is different in wavelength from the portion of the sunlight subjected to sunlight-into-electricity conversion, thereby permitting sunlight of the entire wavelength range to be effectively converted into energy.

Furthermore, according to the present invention, hermetic sealing of the heat collecting plate in the light-permeable outer tube may eliminate dust contamination and the influence of rain and frost which exert adverse effects upon the characteristics of the solar cells, and may also reduce the intensity of ultraviolet rays which exert considerably adverse effects upon the life-time of the solar cells, whereby the life-time of the solar cells may advantageously be lengthened.

In connection with solar heat collecting effect, the present invention is so arranged as to provide an insulating space around the outer circumferential surface of the heating medium tube, thus preventing heat radiation from the heating medium tube.

Further, according to the present invention, since a plurality of amorphous silicon solar cells formed on the surface of the heat collecting plate through the insulating films are connected in series to each other, high electromotive force may be provided.

We claim:

1. A sunlight-into-energy conversion apparatus, comprising:
a heating medium tube;
a heat collecting element thermally connected to the heating medium tube and having a surface; and
at least one amorphous silicon solar cell located on said surface and having a thickness such that the infra-red portion of sunlight incident upon said at least one solar cell will pass therethrough and will heat the heat collecting element.

2. The conversion apparatus defined by claim 1, wherein the heat collecting element is a plate having opposed flat sides and a curved central region which abuts the heating medium tube to permit the sides to extend radially outwardly therefrom.

3. The conversion apparatus defined by claim 1 or 2, wherein the heating medium tube, the heat collecting element and said at least one solar cell are enclosed by and are hermetically sealed within a light-permeable outer tube.

4. The conversion apparatus defined by claim 3, wherein the light-permeable outer tube is substantially coaxial with the heating medium tube.

5. The conversion apparatus defined by claim 4, wherein the outer tube is evacuated.

6. The conversion apparatus defined by claim 4, wherein end plates close off the outer tube and a pair of electrodes connected across said at least one solar cell pass out of the apparatus through a one of the end plates.

7. The conversion apparatus defined by claim 6, further including an insulating seal which seals a portion of at least one of said pair of electrodes to said one of the end plates.

8. The conversion apparatus defined by claim 1 or 2, wherein said at least one solar cell has a thickness of about $0.1\mu$ to $10\mu$.

9. The conversion apparatus defined by claim 1 or 2, wherein the heat collecting element forms a lower electrode of said at least one solar cell.

10. The conversion apparatus defined by claim 9, wherein end plates close off the outer tube, the heating medium tube projects outwardly from a one of the end plates, and the heating medium tube is electrically connected to the heat collecting element.

11. The conversion apparatus defined by claim 1 or 2, further including an intervening insulating film on said surface which is overlaid by and insulates said at least one solar cell from the heat collecting element.

12. The conversion apparatus defined by claim 11, wherein there are a plurality of amorphous silicon solar cells which are connected in series with each other.

13. The conversion apparatus defined by claim 1 or 2, wherein said at least one solar cell has an upper comb-shaped collector electrode and a lead wire is connected to the electrode.

\* \* \* \* \*